US011177188B1

(12) United States Patent
Tsai et al.

(10) Patent No.: US 11,177,188 B1
(45) Date of Patent: Nov. 16, 2021

(54) HEAT DISSIPATION SUBSTRATE FOR MULTI-CHIP PACKAGE

(71) Applicant: ACTRON TECHNOLOGY CORPORATION, Taoyuan (TW)

(72) Inventors: Hsin-Chang Tsai, Taoyuan (TW); Ching-Wen Liu, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 17/019,333

(22) Filed: Sep. 13, 2020

(30) Foreign Application Priority Data

Jul. 23, 2020 (TW) .................. 109124927

(51) Int. Cl.
*H01L 23/34* (2006.01)
*H01L 23/28* (2006.01)
(Continued)

(52) U.S. Cl.
CPC ........ *H01L 23/367* (2013.01); *H01L 21/4871* (2013.01); *H01L 21/565* (2013.01); *H01L 23/3107* (2013.01); *H01L 23/3121* (2013.01); *H01L 23/49541* (2013.01); *H01L 23/49548* (2013.01); *H01L 23/49568* (2013.01); *H01L 23/49575* (2013.01); *H01L 24/73* (2013.01); *H01L 25/072* (2013.01); *H01L 25/073* (2013.01); *H01L 2224/73263* (2013.01); *H01L 2924/1033* (2013.01); *H01L 2924/10272* (2013.01); *H01L 2924/1203* (2013.01);
(Continued)

(58) Field of Classification Search
CPC ................. H01L 25/072; H01L 25/073; H01L 23/49575; H01L 23/49568; H01L 23/49541; H01L 24/73; H01L 23/367; H01L 23/3121; H01L 23/3107; H01L 21/4871; H01L 21/565; H01L 23/49548
See application file for complete search history.

(56) References Cited

U.S. PATENT DOCUMENTS 7,247,929 B2    7/2007   Miura et al.
7,812,437 B2 *   10/2010   Noquil .............. H01L 23/49562
                                                                                                 257/690

(Continued)

FOREIGN PATENT DOCUMENTS

CN         209119085       7/2019
TW          M573515       1/2019

*Primary Examiner* — Alonzo Chambliss
(74) *Attorney, Agent, or Firm* — JCIPRNET

(57) ABSTRACT

A chip packaging structure includes a heat dissipation substrate, a pre-molded chipset, an interconnection and a second encapsulant. The pre-molded chipset is located on the heat dissipation substrate. The interconnection is located in the packaging structure and electrically connects the heat dissipation substrate and the pre-molded chipset. The second encapsulant covers part of the heat dissipation substrate, part or all of the interconnection, and part or all of the pre-molded chipset. The pre-molded chipset includes a thermally conductive substrate, at least two chips, a patterned circuit, and a first encapsulant. The patterned circuit is located in the pre-molded chipset. At least two chips are electrically connected by the patterned circuit. The first encapsulant covers at least two chips and part or all of the patterned circuit. A manufacturing method of a chip packaging structure is also provided.

12 Claims, 11 Drawing Sheets

(51) Int. Cl.
  *H01L 21/00*      (2006.01)
  *H05K 7/20*       (2006.01)
  *H05K 7/18*       (2006.01)
  *H01L 23/367*     (2006.01)
  *H01L 23/31*      (2006.01)
  *H01L 25/07*      (2006.01)
  *H01L 23/00*      (2006.01)
  *H01L 21/48*      (2006.01)
  *H01L 21/56*      (2006.01)
  *H01L 23/495*     (2006.01)

(52) U.S. Cl.
  CPC .............. *H01L 2924/13055* (2013.01); *H01L 2924/13091* (2013.01)

(56) References Cited

U.S. PATENT DOCUMENTS

| | | | |
|---|---|---|---|
| 8,125,080 B2* | 2/2012 | Lee | H01L 24/40 257/724 |
| 2005/0161785 A1* | 7/2005 | Kawashima | H01L 24/73 257/678 |
| 2006/0091512 A1* | 5/2006 | Shinohara | H01L 23/4334 257/678 |
| 2007/0090523 A1* | 4/2007 | Otremba | H01L 24/36 257/727 |
| 2010/0133674 A1* | 6/2010 | Hebert | H01L 24/37 257/686 |
| 2017/0345735 A1* | 11/2017 | Yang | H01L 25/0655 |

\* cited by examiner

HEAT DISSIPATION SUBSTRATE FOR MULTI-CHIP PACKAGE

CROSS-REFERENCE TO RELATED APPLICATION

This application claims the priority benefit of Taiwan application serial no. 109124927, filed on Jul. 23, 2020. The entirety of the above-mentioned patent application is hereby incorporated by reference herein and made a part of this specification.

BACKGROUND

1. Technical Field

The disclosure relates to a packaging structure and a method of manufacturing the same, and particularly relates to a chip packaging structure and a method of manufacturing the same.

2. Description of Related Art

Generally speaking, the problem of heat dissipation for chips with high heating density lies in hot spots. Therefore, spreading resistance strongly affects overall performance and service life of chips. Specifically, when a hot spot has high spreading resistance, the performance of chips will be affected and the service life of chips will be shortened. Therefore, how to solve the hot spot problem in chips, reduce the spreading resistance and effectively enhance the heat dissipation capability to improve the performance and increase the service life of chips has become a challenge.

SUMMARY

The disclosure provides a chip packaging structure and a method of manufacturing the same capable of reducing the total cost of the chip packaging structure while improving the performance and increasing the service life of the chip.

A chip packaging structure of the disclosure includes a heat dissipation substrate, a pre-molded chipset, an interconnection, and a second encapsulant. The pre-molded chipset is located on the heat dissipation substrate. The interconnection is located in the packaging structure and electrically connects the heat dissipation substrate and the pre-molded chipset. The second encapsulant covers part of the heat dissipation substrate, part or all of the interconnection, and part or all of the pre-molded chipset. The pre-molded chipset includes a thermally conductive substrate, at least two chips, a patterned circuit, and a first encapsulant. The at least two chips are located on the thermally conductive substrate and thermally coupled to the thermally conductive substrate. The patterned circuit is located in the pre-molded chipset. The at least two chips are electrically connected by the patterned circuit. The first encapsulant covers the at least two chips and part or all of the patterned circuit.

A method of manufacturing a chip packaging structure of the disclosure includes the following steps: disposing a pre-molded chipset on a heat dissipation substrate; forming an interconnection to electrically connect the heat dissipation substrate and the pre-molded chipset; and forming a second encapsulant to cover part of the heat dissipation substrate, part or all of the interconnection, and part or all of the pre-molded chipset. The step of forming the pre-molded chipset includes: providing a thermally conductive substrate; disposing at least two chips on the thermally conductive substrate in which the at least two chips are thermally coupled to the thermally conductive substrate; forming a patterned circuit on the at least two chips, such that the at least two chips are electrically connected by the patterned circuit; and forming a first encapsulant to encapsulate the at least two chips and part or all of the patterned circuit.

Therefore, the chip packaging structure of the disclosure is formed by thermally coupling a chipset formed by pre-assembling the at least two chips to the thermally conductive substrate, packaging the thermally conductive substrate and the chipset into a pre-molded chipset by an encapsulant, and disposing the pre-molded chipset on the heat dissipation substrate. In this way, the heat concentration problem from a single chip architecture can be solved and the spreading resistance can be reduced in advance. In addition, the heat dissipation capability of chip packaging is effectively enhanced and the total cost of the used chips is reduced. Therefore, the performance of the chip can be improved and the service life of the chip can be increased while the total cost of the chip packaging structure is reduced.

In order to make the above-mentioned features and advantages of the disclosure more comprehensible, the following specific embodiments are described in detail in conjunction with the accompanying drawings.

BRIEF DESCRIPTION OF THE DRAWINGS

The accompanying drawings are included to provide a further understanding of the disclosure, and are incorporated in and constitute a part of the disclosure. The drawings illustrate embodiments of the disclosure and, together with the description, serve to explain the principles of the disclosure.

DESCRIPTION OF THE EMBODIMENTS

Figure 1:
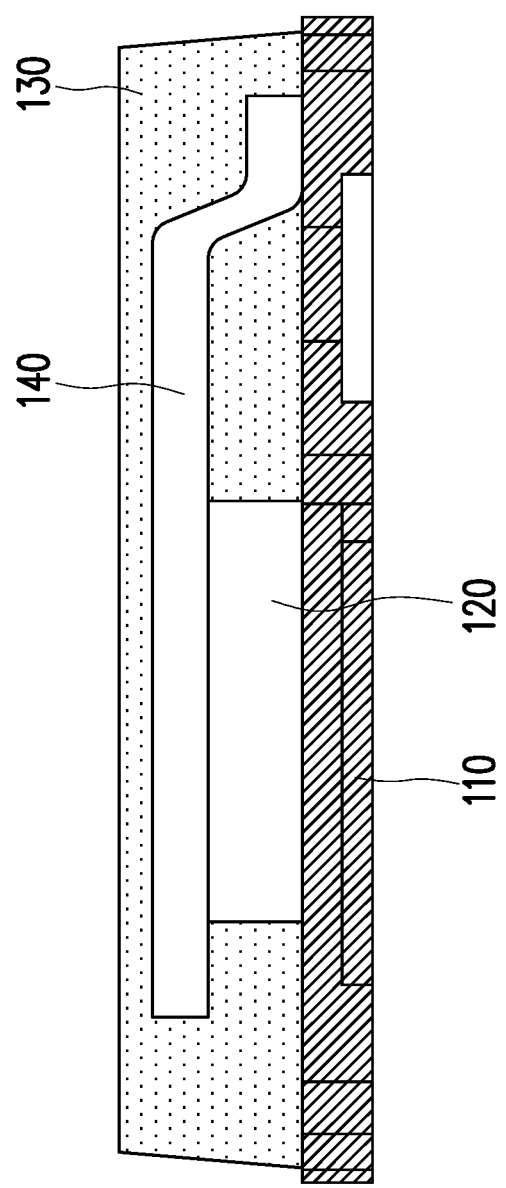
FIG. 1 is a schematic cross-sectional view of a chip packaging structure according to an embodiment of the disclosure.

The exemplary embodiments of the disclosure will be fully described below with reference to the drawings, but the disclosure may also be implemented in various different forms and should not be construed as being limited to the embodiments described herein. In the drawings, for the purpose of clarity, the size and thickness of each region, location, and layer may not be drawn to actual scale. To facilitate understanding, the same elements in the following description will be described with the same reference numerals.

Unless clearly stated otherwise, any method described herein is in no way intended to be interpreted as requiring the steps to be performed in a specific order.

FIG. 1 is a schematic cross-sectional view of a chip packaging structure according to an embodiment of the disclosure. FIG. 2A to FIG. 2H are three-dimensional schematic views of a chip packaging structure in different stages of a manufacturing process according to an embodiment of the disclosure. FIG. 3A is a schematic cross-sectional view of an electrical connection mode of at least two chips of a chip packaging structure according to an embodiment of the disclosure.

Referring to FIG. 1, in the present embodiment, a chip packaging structure 100 includes a heat dissipation substrate 110, a pre-molded chipset 120, an encapsulant 130, and an interconnection 140. The material of the heat dissipation substrate 110 is not limited in the disclosure. The heat dissipation substrate 110 may be made of any suitable heat dissipation material, such as copper, aluminum or graphite. In some embodiments, the heat dissipation substrate 110 may be a metal lead frame, an insulated metal substrate, or an insulated ceramic substrate. In addition, the pre-molded chipset 120 is located on the heat dissipation substrate 110, the interconnection 140 is located in the chip packaging structure 100, and the encapsulant 130 covers part of the heat dissipation substrate 110, part or all of the interconnection 140, and part or all of the pre-molded chipset 120. In the present embodiment, the interconnection 140 is, for example, a copper clip. In other embodiments, the interconnection 140 is, for example, a wire bonding structure or other conductive structure to electrically connect the pre-molded chipset 120 and the heat dissipation substrate 110.

In some embodiments, the encapsulant 130 may be a molding compound formed by a molding process, or a silicone gel formed by a potting process. In an embodiment, the encapsulant 130 may be formed of insulating materials such as epoxy resin or other suitable resins, but the disclosure is not limited thereto.

In the present embodiment, the method of manufacturing the pre-molded chipset 120 may include the following steps.

Figure 2A:
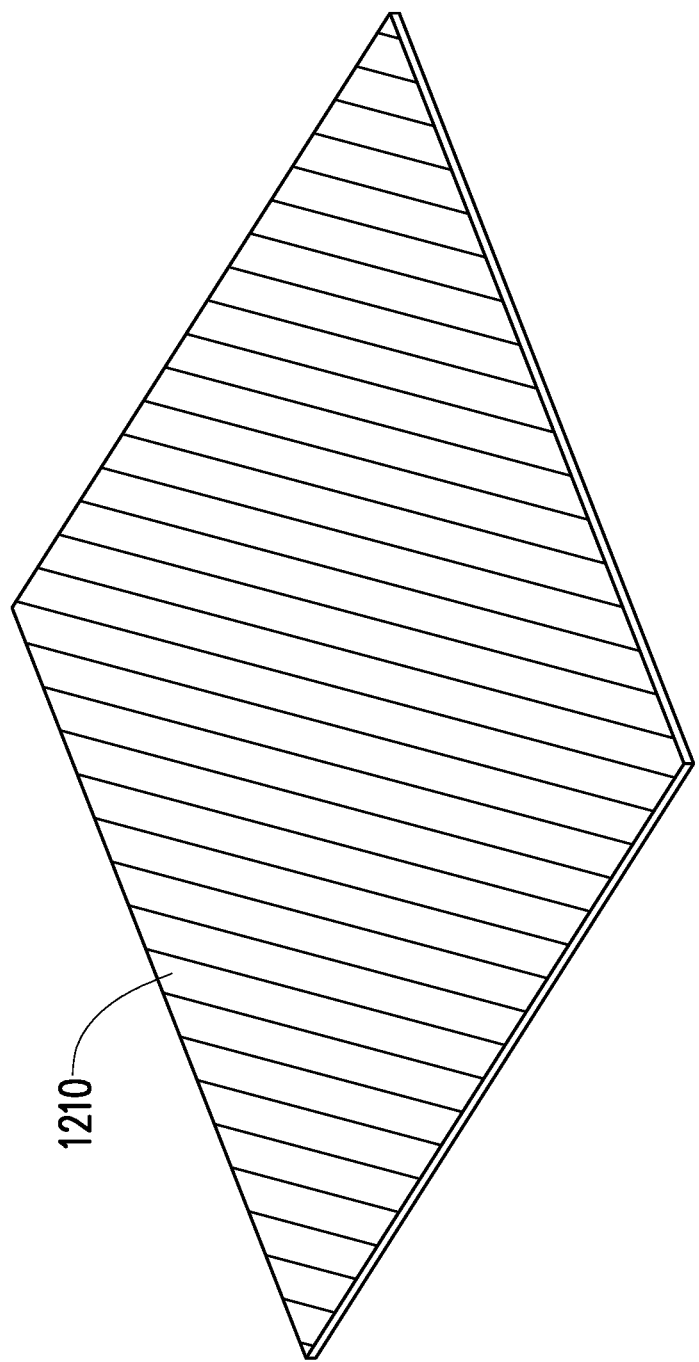
FIG. 2A to FIG. 2H are three-dimensional schematic views of a chip packaging structure in different stages of a manufacturing process according to an embodiment of the disclosure.
Figure 3A:
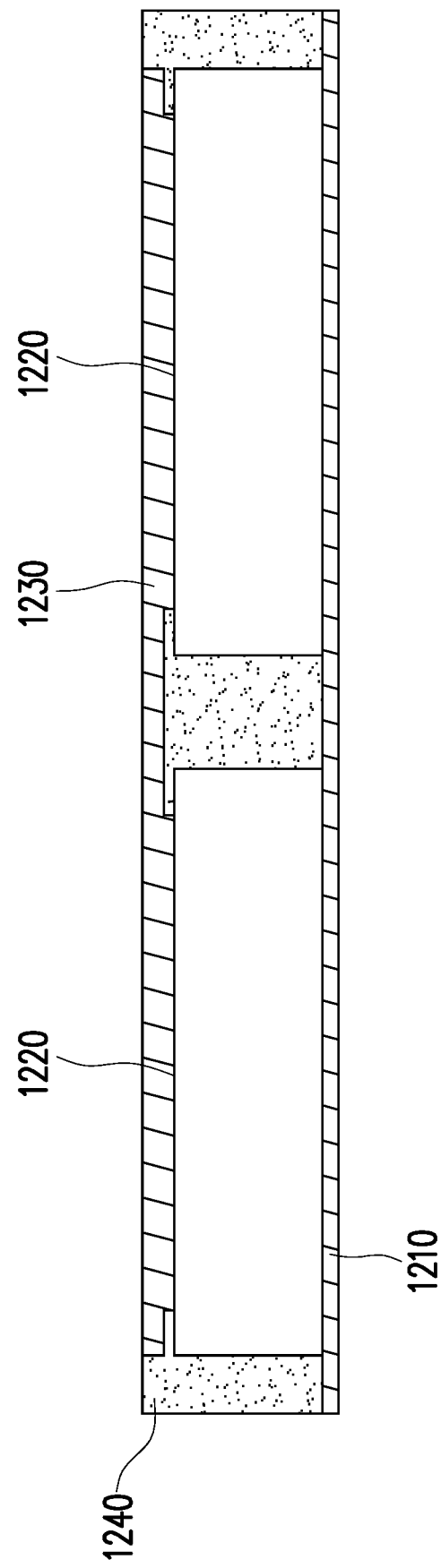
FIG. 3A is a schematic cross-sectional view of an electrical connection mode of at least two chips of a chip packaging structure according to an embodiment of the disclosure.

Please refer to FIG. 2A. First, a thermally conductive substrate 1210 is provided. In some embodiments, in order to have better thermal conductivity, the material thermal conductivity of the thermally conductive substrate 1210 may be larger than 50 W/m-k. The material of the thermally conductive substrate 1210 may be copper, aluminum, or graphite, for example. However, the material of the thermally conductive substrate 1210 of the disclosure is not limited thereto. The thermally conductive substrate 1210 may be made of any suitable thermally conductive material. In some embodiments, the thermally conductive substrate 1210 may be, for example, a metal substrate, a metal lead frame, an insulated metal substrate, or an insulated ceramic substrate.

Figure 2B:
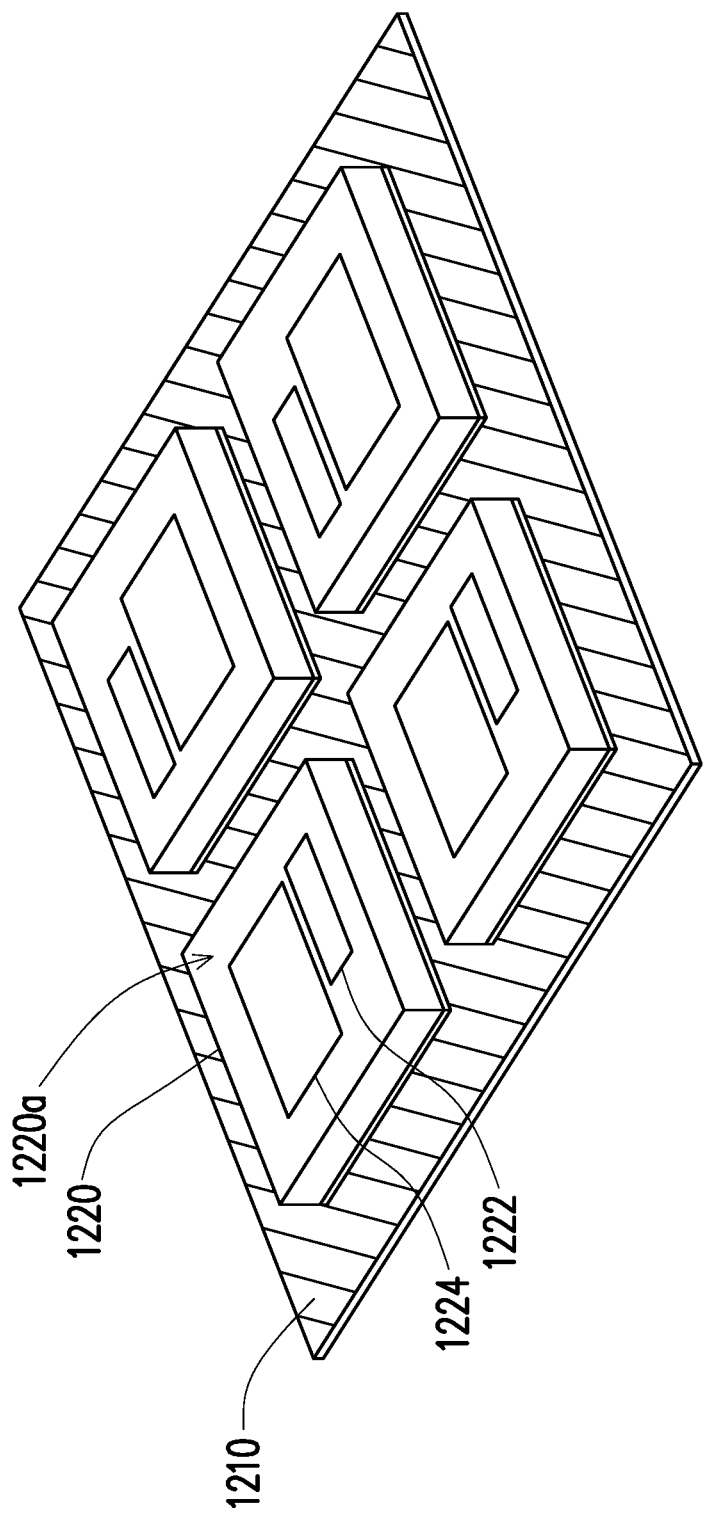

Referring to FIG. 2B, at least two chips 1220 are disposed on the thermally conductive substrate 1210 (four chips are schematically shown in FIG. 2B), in which the at least two chips 1220 are thermally coupled to the thermally conductive substrate 1210. Here, thermal coupling may be defined as the at least two chips 1220 transferring heat to the thermally conductive substrate 1210. In some embodiments, an adhesive layer (not shown) is further included between the at least two chips 1220 and the thermally conductive substrate 1210 to adhere the at least two chips 1220 and the thermally conductive substrate 1210.

In the above embodiment, the at least two chips 1220 are identical. Since the larger the size of a single chip, the higher the cost of the chip required, in the present embodiment, multiple smaller-sized identical chips 1220 are assembled into a chipset, such that the chipset maintains the same electrical characteristics as a single large-sized chip while avoiding excessive heat concentration and reducing chip cost, thereby reducing the overall spreading resistance and total cost of the chip packaging structure.

In some embodiments, the chip 1220 may be a three-terminal chip, a two-terminal chip, or a multi-terminal chip. The three-terminal chip may include a gate, a source, and a drain; the two-terminal chip may include a positive terminal and a negative terminal; and the multi-terminal chip may include additional terminals for specific function such as current sensing or voltage clamping. For example, the chip 1220 may include a power metal-oxide semiconductor field effect transistor (Power MOSFET), a fast recovery diode (FRD), an insulated-gate bipolar transistor (IGBT), or a combination thereof, and each chip 1220 in the pre-molded chipset 120 may be the same as or different from each other. However, the disclosure is not limited thereto. The chip 1220 may be any suitable type of chip according to actual design requirements.

It should be noted that although the combination of four three-terminal chips is shown in FIG. 2B, the combination mode of the chips 1220 of the disclosure is not limited thereto, and may be arranged according to actual design requirements. For example, in some embodiments, the at least two chips 1220 may all be three-terminal chips. In other embodiments, the at least two chips 1220 may all be two-terminal chips. In yet other embodiments, the at least two chips 1220 may include a combination of three-terminal chips and two-terminal chips.

In some embodiments, the chip 1220 may be a silicon carbide (SiC) or gallium nitride (GaN) wide bandgap semiconductor. Since the larger the size of the wide bandgap semiconductor chip, the lower the yield rate, the wide bandgap single large-sized chip has a disadvantage of being more expensive than multiple small-sized chips. As a result, the disposition of the chipset can more effectively reduce the total cost of the chip packaging structure including the wide bandgap chip, but the disclosure is not limited thereto.

In the present embodiment, as shown in FIG. 2B, a three-terminal chip is used as an example of chip 1220; the chip 1220 of the present embodiment includes a gate 1222, a source 1224, and a drain (not shown). The gate 1222 and the source 1224 of the at least two chips 1220 may be located on a front side 1220a of the chip 1220, and the drain may be located on a back side opposite to the gate 1222 and the source 1224. In other words, the chip 1220 may be disposed on the thermally conductive substrate 1210 with the front side 1220a where the gate 1222 and the source 1224 are located facing upwards. Therefore, compared to the gate 1222 and the source 1224 of the chip 1220, the drain of the chip 1220 is closer to the thermally conductive substrate 1210, but the disclosure is not limited thereto; the disposition of the chip 1220 may be adjusted according to actual needs. In other words, the chip 1220 may disposed on the thermally conductive substrate 1210 by face-up die bonding, or may be disposed on the thermally conductive substrate 1210 by face-down die bonding (hence, "flipped").

Please refer to FIG. 2C to FIG. 2F and FIG. 3A at the same time. A patterned circuit 1230 is formed on the at least two chips 1220, such that the at least two chips 1220 are electrically connected by the patterned circuit 1230. In the present embodiment, as shown in FIG. 3A, the at least two chips 1220 may be electrically connected in parallel via a patterned circuit 1230, but the disclosure is not limited thereto. In other embodiments, the at least two chips 1220 may be electrically connected by a patterned circuit in other ways, for example, electrically connected in series.

Figure 2C:
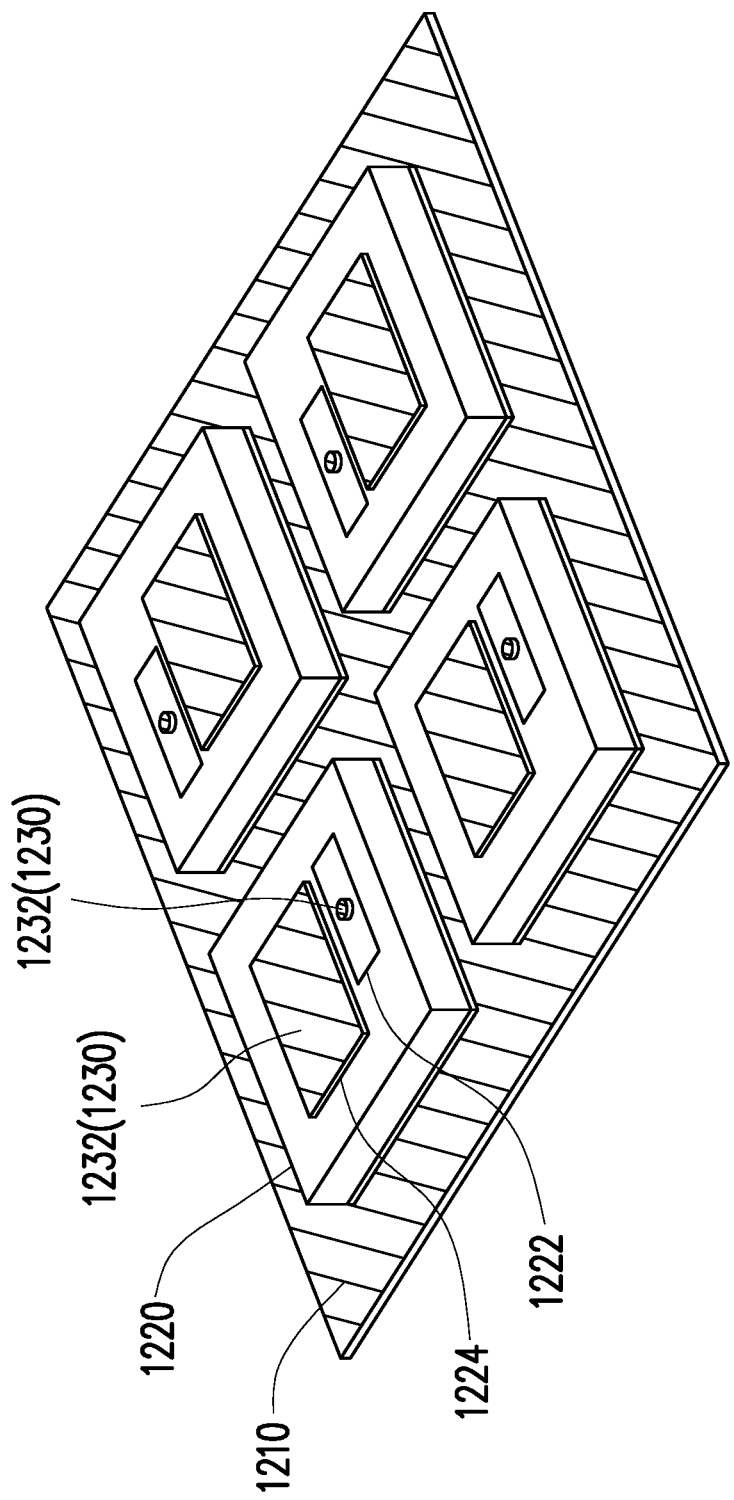
Figure 2D:
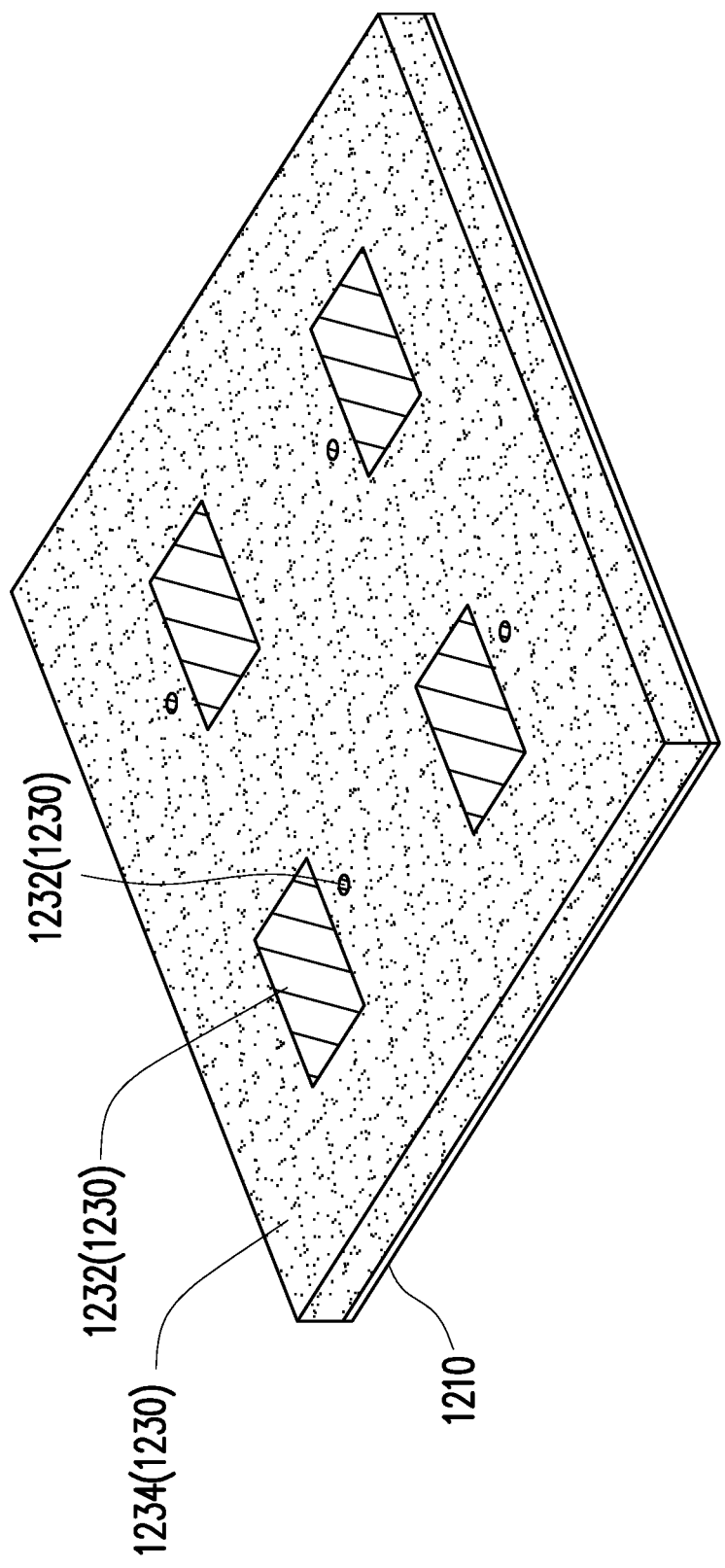

Furthermore, the patterned circuit 1230 may be formed by the following steps. First, as shown in FIG. 2C, a conductor layer 1232 is formed on the chip 1220 to form electrodes. Specifically, the electrodes may be formed on the gate 1222 and the source 1224 of the chip 1220 and disposed for subsequent electrical connection between the gate 1222 and the source 1224. Next, as shown in FIG. 2D, a dielectric layer 1234 is formed on the conductor layer 1232 to electrically isolate the electrodes, in which the dielectric layer 1234 may expose the tops of electrodes of the gate 1222 and the source 1224.

Figure 2E:
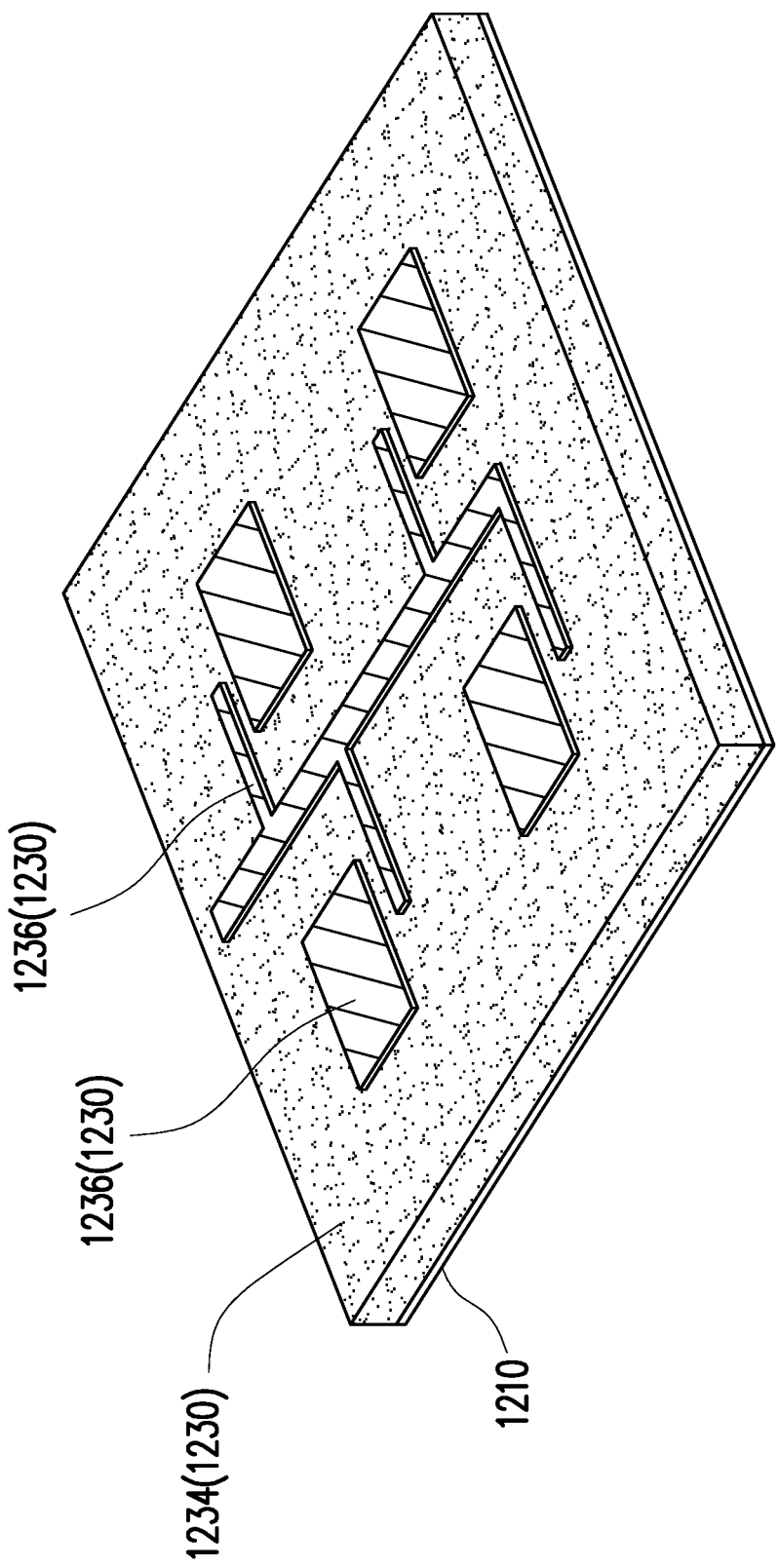
Figure 2F:
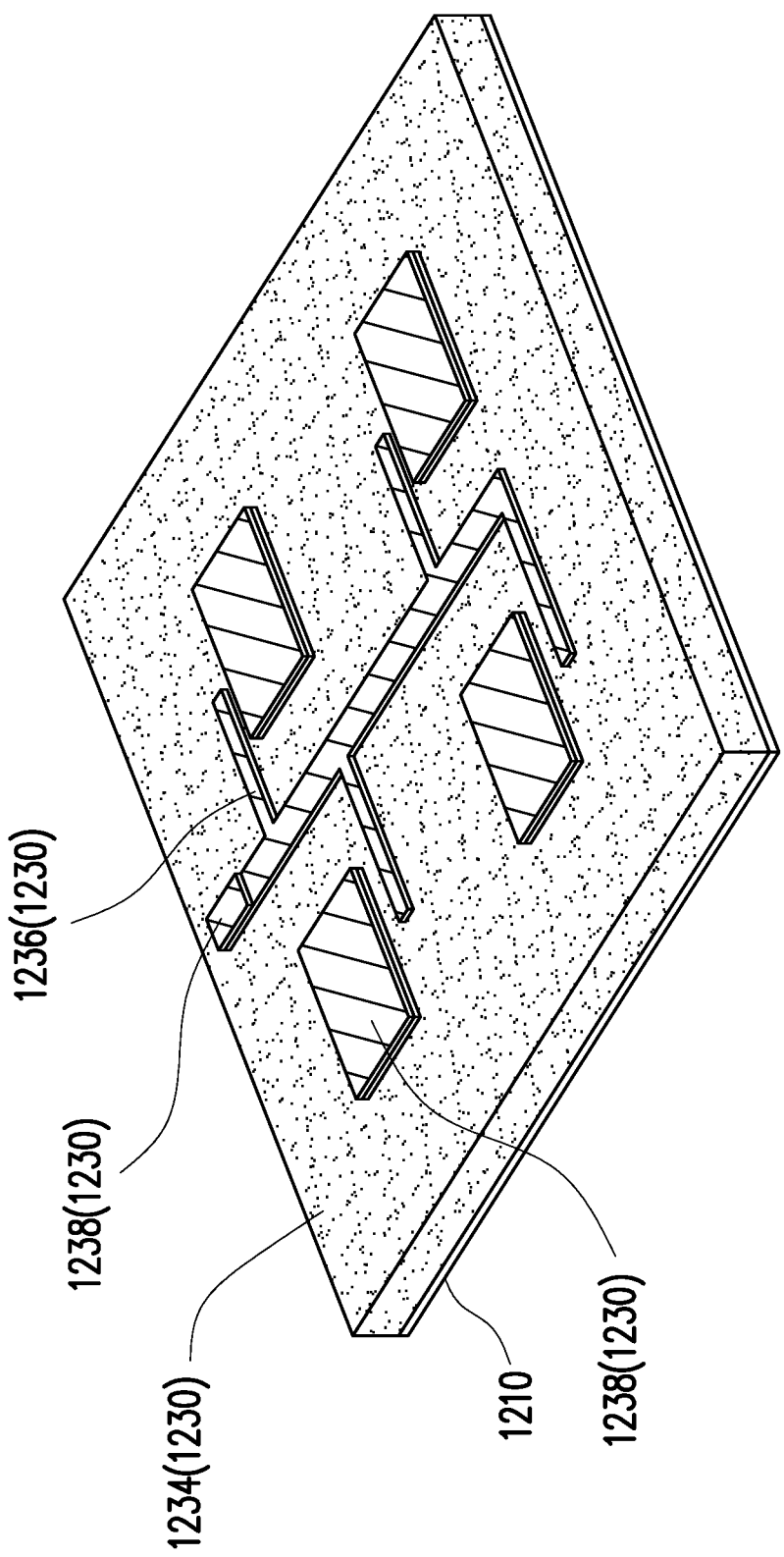

Then, as shown in FIG. 2E, a conductor layer 1236 is formed on the dielectric layer 1234, such that an electrical connection routing is formed between the gates 1222 of the at least two chips 1220 and that the electrode structure above the source 1224 is thickened. After that, as shown in FIG. 2F, a conductor layer 1238 is formed on the conductor layer 1236 and disposed for subsequent electrical connection between the gate 1222, the source 1224, and an exposed pad 1250 (please refer to FIG. 2H). In this way, the conductor layer 1232, the dielectric layer 1234, the conductor layer 1236, and the conductor layer 1238 may form the patterned circuit 1230.

The materials of the conductor layer 1232, the conductive layer 1236, and the conductive layer 1238 are copper layers formed by electroplating, for example, and the dielectric layer 1234 is an epoxy resin layer formed by a molding process, for example. However, the disclosure is not limited thereto. The conductor layer 1232, the conductor layer 1236, the conductor layer 1238, and the dielectric layer 1234 may be formed by any suitable materials and methods.

It should be noted that the connection mode and the number of layers of the conductor layer and the dielectric layer in the patterned circuit 1230 of the disclosure may be adjusted according to actual design requirements, and is not limited to the connection mode and the number of layers in the present embodiment.

Figure 2G:
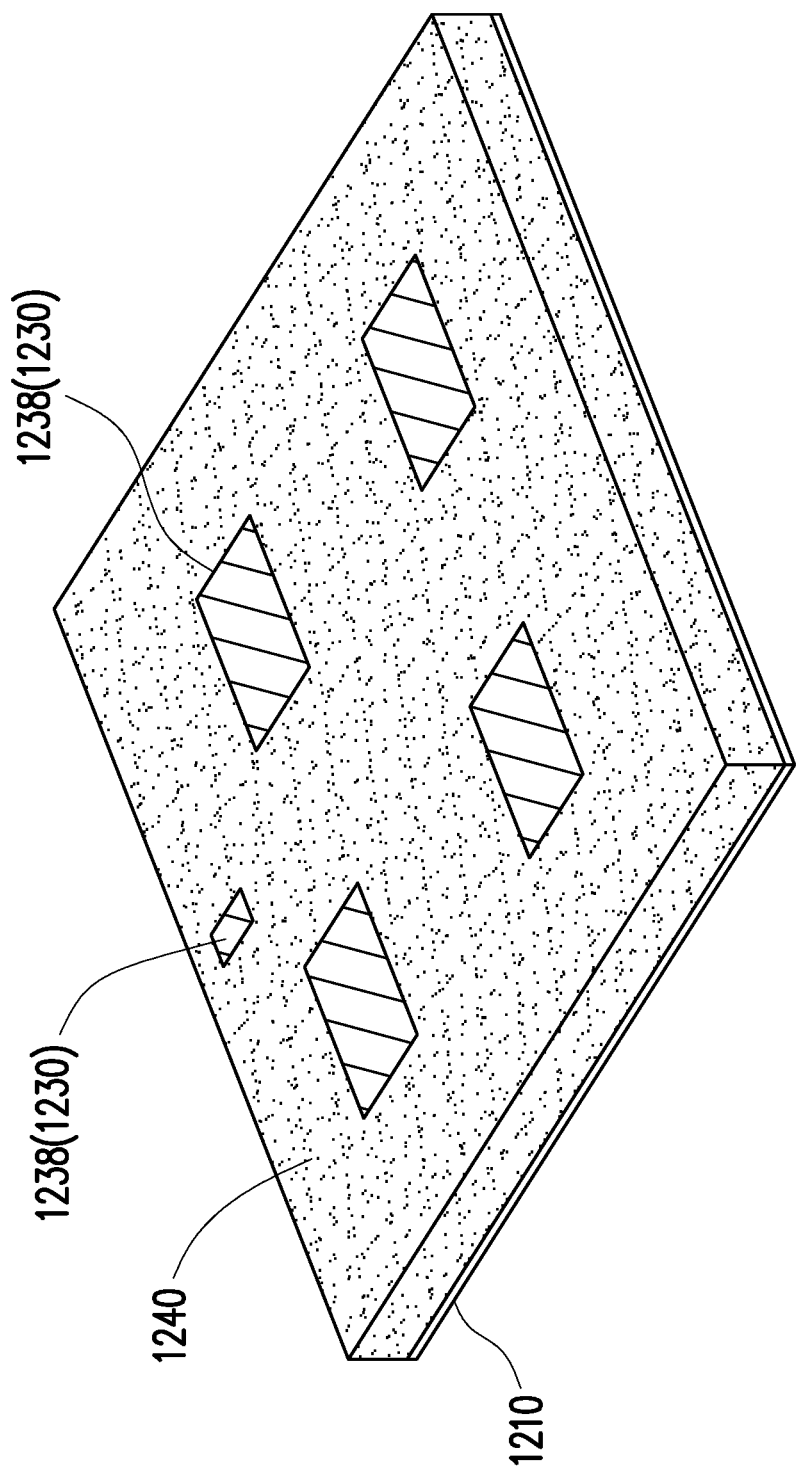

Please refer to FIG. 2G. An encapsulant 1240 is formed to cover the at least two chips 1220 and part or all of the patterned circuit 1230. In some embodiments, the encapsulant 1240 may be a molding compound or a silicon gel formed by a molding process or a potting process. In an embodiment, the encapsulant 1240 may be formed of insulating materials such as epoxy resin or other suitable resins, but the disclosure is not limited thereto.

In the present embodiment, the encapsulant 1240 and the encapsulant 130 may be formed in different steps. For example, a first packaging may be performed to form the pre-molded chipset 120 with the encapsulant 1240. Then, a second packaging may be performed, in which the pre-molded chipset 120 is disposed on the heat dissipation substrate 110 to further form the encapsulant 130 so as to encapsulate the pre-molded chipset 120 and the heat dissipation substrate 110.

In some embodiments, the materials of encapsulant 1240 and encapsulant 130 may be different. In other embodiments, the materials of encapsulant 1240 and encapsulant 130 may be substantially the same. It should be noted that since the encapsulant 1240 and the encapsulant 130 are formed in different steps, even if the materials of the encapsulant 1240 and the encapsulant 130 are substantially the same, there will still be an interface at the adjacent position of the two. In addition, the encapsulant 1240 may be the first encapsulant and the encapsulant 130 may be the second encapsulant.

Figure 2H:
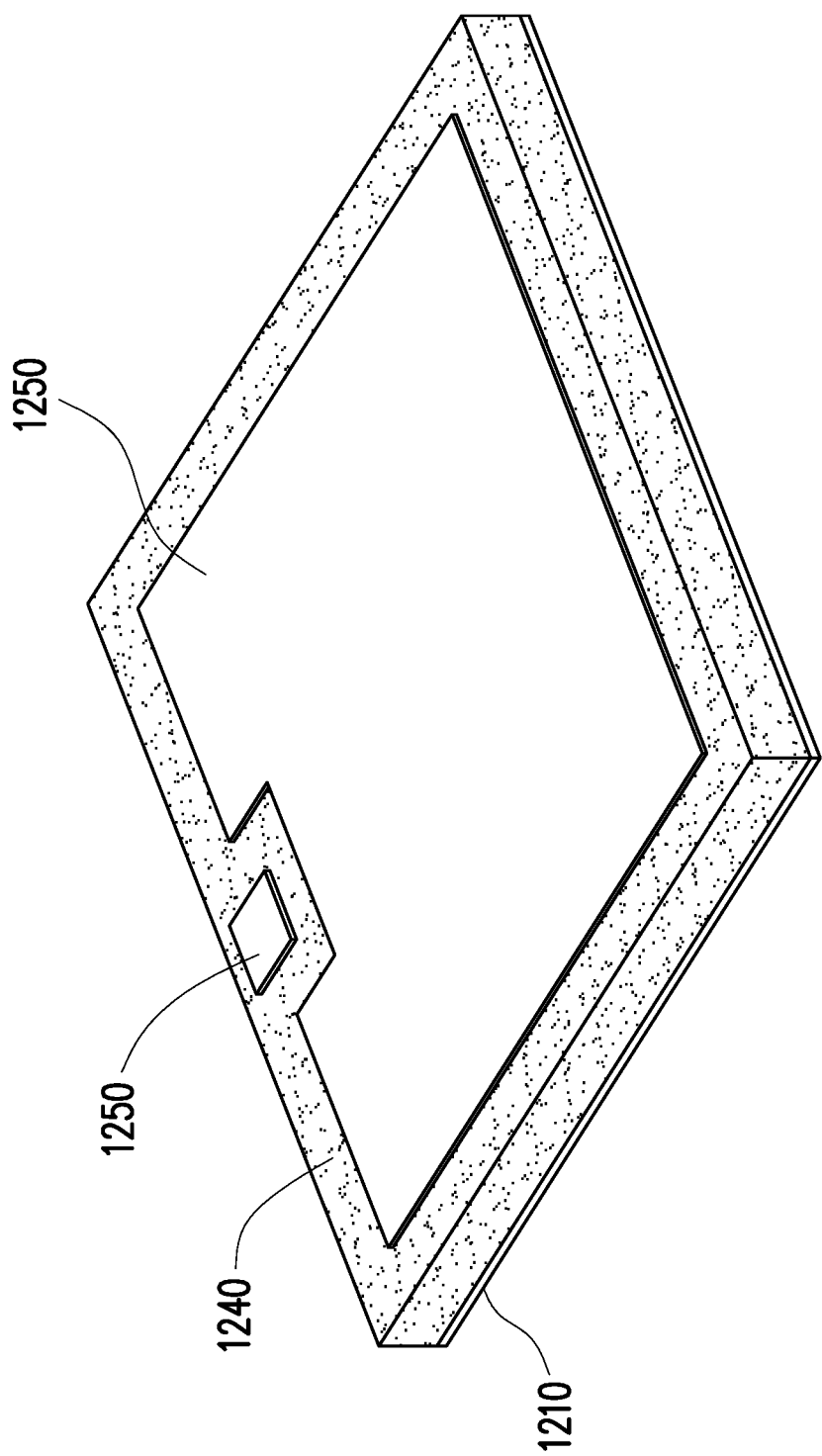

Please refer to FIG. 2H. In the present embodiment, the exposed pad 1250 may further be formed on the encapsulant 1240, such that the at least two chips 1220 may be electrically connected to the heat dissipation substrate 110 by the interconnection 140 through the exposed pad 1250, or that the exposed pad 1250 may be directly electrically connected to the heat dissipation substrate 110. Referring to FIG. 1 again, when the pre-molded chipset 120 is disposed on the heat dissipation substrate 110 with the exposed pad 1250 upward and the thermally conductive substrate 1210 downward, the exposed pad 1250 of the pre-molded chipset 120 is electrically connected to the heat dissipation substrate 110 by the interconnection 140, and the thermally conductive substrate 1210 of the pre-molded chipset 120 is directly electrically connected to the heat dissipation substrate 110. When the pre-molded chipset 120 is disposed on the heat dissipation substrate 110 with the thermally conductive substrate 1210 upward and the exposed pad 1250 downward, the exposed pad 1250 of the pre-molded chipset 120 is directly electrically connected to the heat dissipation substrate 110, and the thermally conductive substrate 1210 is electrically connected to the heat dissipation substrate 110 by the interconnection 140. The exposed pad 1250 is, for example, a copper layer formed by electroplating, but the disclosure is not limited thereto.

In the present embodiment, the chip packaging structure 100 includes the heat dissipation substrate 110, the pre-molded chipset 120, the second encapsulant 130, and the interconnection 140. The pre-molded chipset 120 is located on the heat dissipation substrate 110, and the interconnection 140 electrically connects the heat dissipation substrate 110 and the pre-molded chipset 120. The pre-molded chipset 120 includes the thermally conductive substrate 1210, the at least two chips 1220, the patterned circuit 1230, and the encapsulant 1240. The at least two chips 1220 are located on the thermally conductive substrate 1210 and thermally coupled to the thermally conductive substrate 1210. The patterned circuit 1230 is located in the pre-molded chipset 120, in which the at least two chips 1220 are electrically connected by the patterned circuit 1230. The encapsulant 1240 covers the at least two chips 1220 and part or all of the patterned circuit 1230.

In the above embodiment, between the pre-molded chipset 120 and the interconnection 140, and between the pre-molded chipset 120 and the heat dissipation substrate 110, an adhesive layer (not shown) may respectively further be included to adhere the pre-molded chipset 120 with the heat dissipation substrate 110 and the interconnection 140.

Therefore, the chip packaging structure 100 of the present embodiment is formed by thermally coupling a chipset formed by pre-assembling the at least two chips 1220 to the thermally conductive substrate 1210, packaging the thermally conductive substrate 1210 and the chipset into the pre-molded chipset 120 by the encapsulant 1240, and disposing the pre-molded chipset 120 on the heat dissipation substrate 110. In this way, the spreading resistance can be reduced and the heat concentration problem of the chip 1220 can be solved. In addition, the heat dissipation capability can be effectively enhanced and the cost of the chip 1220 can be reduced. Therefore, the performance of the chip 1220 is improved and the service life of the chip 1220 is increased while the total cost of the chip packaging structure 100 is reduced.

Specifically, the heat generated by the chip 1220 may be guided through the thermally conductive substrate 1210 of the pre-molded chipset 120, and then dissipated through the heat dissipation substrate 110, such that the heat is not excessively concentrated in a partial area. Accordingly, the heat concentration problem of the chip 1220 can be solved; the spreading resistance can be reduced and the heat dissipation capability can be effectively enhanced, such that the performance of the chip 1220 is improved and the service life of the chip 1220 is increased. Further, since the larger the size of a single chip, the higher the cost of the chip required, assembling multiple smaller-sized identical chips 1220 into a chipset can reduce the cost of the chip 1220 while the chip 1220 maintains the same electrical characteristics as a single large-sized chip, thereby reducing the total cost of the chip packaging structure 100.

In some embodiments, the structural spreading resistance of the chip packaging structure 100 may be reduced from 1.208 (° C./W) to 0.707 (° C./W). In other words, the chip packaging structure 100 can effectively reduce the structural spreading resistance, thereby reducing the overall structural thermal resistance by about 40%, but the disclosure is not limited thereto.

In some embodiments, the chip packaging structure 100 may be, for example, a power chip packaging structure, but the disclosure is not limited thereto.

It must be noted here that the following embodiments follow the reference numerals of the components and part of the content of the above embodiment, in which the same or similar reference numerals are used to represent the same or similar elements, and the description of the same technical content is omitted. The description of the omitted parts can be found in the foregoing embodiment and will not be repeated in the following embodiment.

Figure 3B:
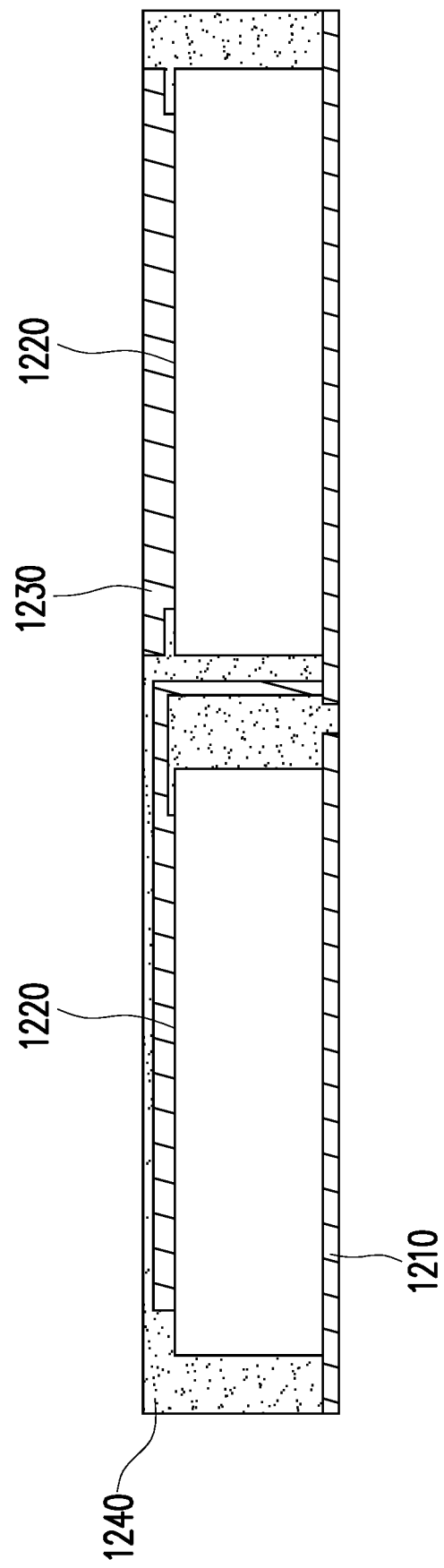
FIG. 3B is a schematic cross-sectional view of an electrical connection mode of at least two chips of a chip packaging structure according to another embodiment of the disclosure.

FIG. 3B is a schematic cross-sectional view of an electrical connection mode of at least two chips of a chip packaging structure according to another embodiment of the disclosure. Please refer to FIG. 3B. The embodiment of FIG. 3B is similar to the embodiment of FIG. 3A; the difference is that in the embodiment of FIG. 3B, the at least two chips 1220 may be electrically connected in series by a patterned circuit 1230, such that the electrical connection mode can be more flexibly arranged in the pre-molded chipset 120.

In summary, the heat generated by the chip of the chip packaging structure of the disclosure may be guided through the thermally conductive substrate of the pre-molded chipset, and then dissipated through the heat dissipation substrate, such that the heat is not excessively concentrated in a partial area. Accordingly, the heat concentration problem of the chip can be solved; the structural spreading resistance can be reduced and the heat dissipation capability can be effectively enhanced, such that the performance of the chip is improved and the service life of the chip is increased. In addition, since the larger the size of a single chip, the higher the cost of the chip required, assembling multiple smaller-sized identical chips into a chipset can reduce the cost of the chip while the chip maintains the same electrical characteristics as a single large-sized chip, thereby reducing the total cost of the chip packaging structure.

Although the disclosure has been disclosed in the above embodiments, the disclosure is not limited thereto. Anyone with ordinary knowledge in the relevant technical field may make some changes and modifications without departing from the spirit and scope of the disclosure. The scope of protection of the disclosure shall be subject to those defined by the following claims.

What is claimed is:

1. A chip packaging structure, comprising:
    a heat dissipation substrate;
    a pre-molded chipset located on the heat dissipation substrate, wherein the pre-molded chipset comprises:
        a thermally conductive substrate;
        at least two chips located on the thermally conductive substrate and thermally coupled to the thermally conductive substrate;
        a patterned circuit located in the pre-molded chipset, wherein the at least two chips are electrically connected by the patterned circuit; and
        a first encapsulant covering the at least two chips and part or all of the patterned circuit;
    an interconnection located in the chip packaging structure, and electrically connecting the heat dissipation substrate and the pre-molded chipset; and
    a second encapsulant covering part of the heat dissipation substrate, part or all of the interconnection, and part or all of the pre-molded chipset.

2. The chip packaging structure according to claim 1, wherein the at least two chips are electrically connected in series or in parallel by the patterned circuit.

3. The chip packaging structure according to claim 1, wherein the at least two chips comprise a metal-oxide semiconductor field effect transistor, a fast recovery diode, an insulated-gate bipolar transistor, a silicon carbide wide bandgap semiconductor transistor, a gallium nitride wide bandgap semiconductor transistor, or a combination thereof.

4. The chip packaging structure according to claim 1, wherein the heat dissipation substrate is a metal lead frame, an insulated metal substrate or an insulated ceramic substrate, and the thermally conductive substrate is a metal substrate, a metal lead frame, an insulated metal substrate, or an insulated ceramic substrate.

5. The chip packaging structure according to claim 1, wherein the pre-molded chipset comprises an exposed pad located on the first encapsulant, and wherein the at least two chips are electrically connected to the heat dissipation substrate by the interconnection through the exposed pad, and the thermally conductive substrate of the pre-molded chipset is directly electrically connected to the heat dissipation substrate.

6. The chip packaging structure according to claim 1, wherein the pre-molded chipset comprises an exposed pad located on the first encapsulant, and wherein the at least two chips are directly electrically connected to the heat dissipation substrate through the exposed pad, and the thermally conductive substrate of the pre-molded chipset is electrically connected to the heat dissipation substrate through the interconnection.

7. The chip packaging structure according to claim 1, wherein the at least two chips are identical.

8. The chip packaging structure according to claim 1, wherein an adhesive layer is further comprised between the at least two chips and the thermally conductive substrate to adhere the at least two chips and the thermally conductive substrate.

9. The chip packaging structure according to claim 1, wherein, between the pre-molded chipset and the interconnection, and between the pre-molded chipset and the heat dissipation substrate, the adhesive layer is respectively comprised to adhere the pre-molded chipset with the heat dissipation substrate and the interconnection.

10. A method of manufacturing a chip packaging structure, the method comprising:
    disposing a pre-molded chipset on a heat dissipation substrate, wherein a step of forming the pre-molded chipset comprises:
        providing a thermally conductive substrate;
        disposing at least two chips on the thermally conductive substrate, wherein the at least two chips are thermally coupled to the thermally conductive substrate;

forming a patterned circuit on the at least two chips, such that the at least two chips are electrically connected by the patterned circuit;
forming a first encapsulant to encapsulate the at least two chips and part or all of the patterned circuit;
forming an interconnection to electrically connect the heat dissipation substrate and the pre-molded chipset; and
forming a second encapsulant to cover part of the heat dissipation substrate, part or all of the interconnection, and part or all of the pre-molded chipset.

11. The method of manufacturing the chip packaging structure according to claim 10, wherein after the pre-molded chipset is formed, the pre-molded chipset is then disposed on the heat dissipation substrate, and wherein the first encapsulant and the second encapsulant are formed in different steps.

12. The method of manufacturing the chip packaging structure according to claim 10, wherein a step of disposing the at least two chips on the thermally conductive substrate comprises disposing the at least two chips on the thermally conductive substrate by face-up die bonding or by face-down die bonding.

\* \* \* \* \*